United States Patent [19]

Kieser et al.

[11] Patent Number: 4,767,641

[45] Date of Patent: Aug. 30, 1988

[54] PLASMA TREATMENT APPARATUS

[75] Inventors: Jörg Kieser, Albstadt; Michael Sellschopp, Hammersbach; Michael Geisler, Wächtersbach, all of Fed. Rep. of Germany

[73] Assignee: Leybold-Heraeus GmbH, Cologne, Fed. Rep. of Germany

[21] Appl. No.: 881,706

[22] Filed: Jul. 3, 1986

[30] Foreign Application Priority Data

Mar. 4, 1986 [DE] Fed. Rep. of Germany ....... 3606959

[51] Int. Cl.$^4$ .................. C23C 14/00; C23C 16/00
[52] U.S. Cl. .................... 427/38; 156/345; 156/643; 118/715; 118/723; 118/729; 118/50.1; 315/111.21; 204/298
[58] Field of Search .............. 156/345, 643, 646; 118/715, 718, 723, 729, 50.1; 427/39, 38; 315/111.21, 111.71; 204/298

[56] References Cited

U.S. PATENT DOCUMENTS

| 4,209,357 | 6/1980 | Gorin et al. | 156/643 |
| 4,351,714 | 9/1982 | Kuriyama | 204/298 |
| 4,612,432 | 9/1986 | Sharp-Geisler | 156/345 X |
| 4,633,809 | 1/1987 | Hirose et al. | 118/50.1 X |
| 4,637,853 | 1/1987 | Bumble et al. | 156/345 |

FOREIGN PATENT DOCUMENTS 2241229 3/1974 Fed. Rep. of Germany .
968097 10/1982 U.S.S.R. ................ 118/50.1

Primary Examiner—David L. Lacey
Attorney, Agent, or Firm—Felfe & Lynch

[57] ABSTRACT

Device for the plasma treatment of substrates (7) in a high frequency-excited plasma discharge between two electrodes (3, 8), supplied by a high-frequency source (6). The first electrode is constructed as a hollow anode (3) and the second electrode (8), which carries the substrate (7), is deposited in front of the hollow space (10) of the hollow anode or can be passed by this. Moreover, the hollow anode (3) has an edge (9), which is drawn out in the direction of the second electrode (8) and which, relative to the second electrode, forms a gap $s_1$ all around that does not exceed 10 mm in width. In order to form the electrode so that the gap width is not a critical feature, projections (12) are disposed in the hollow space (10) of the hollow anode (3), said projections increasing the internal surface area (11) of the hollow anode (3). Preferably, these projections (12) are constructed as rib structures, which may also assume a honeycomb form.

11 Claims, 4 Drawing Sheets

PLASMA TREATMENT APPARATUS

FIELD OF THE INVENTION

The invention relates to a device for the plasma treatment of substrates in a high frequency-excited plasma discharge between two electrodes supplied by a high-frequency source, the first of the said electrodes being constructed as a hollow anode and the second, carrying the substrate, being deposited in front of the hollow space of the hollow anode or capable of being passed by this hollow space, the hollow anode having an edge, which is drawn out in the direction of the second electrode, is at the same potential as the hollow anode and, relative to the second electrode, forms a gap "$s_1$" all around that has a maximum width of 10 mm.

The plasma treatment process, for which the device is intended, may be a plasma etching process, a process for producing polymer layers on substrates by plasma polymerization, a process of activating substrate surfaces, etc.

BACKGROUND AND PRIOR ART

Normally, devices for the plasma treatment of substrates by means of high frequency contain two electrodes, of which one is formed by the vacuum chamber and/or the substrate holder and both comprise metallic material. It is well known in this connection that a voltage, which is predominantly negative relative to the plasma, is formed at that electrode, which has an effective surface area that is smaller than the surfaces acting as the counter electrode. The electrode, biased negatively, is therefore also regularly referred to here as the "cathode".

When using a plate-shaped substrate holder, which is at the same potential as the vacuum chamber and thus forms the one electrode, on the one hand, and using a plate-shaped electrode lying opposite the substrate holder on the other, a negative potential is developed at the lastmentioned electrode because of the area ratio, which is necessarily fixed in such an arrangement. As a result, material (=target) on this electrode (=cathode) is atomized and deposited on the substrate. If such an arrangement is to be used for etching, target and substrate have to be exchanged correspondingly. When a d.c. voltage is used, the polarity of the electrodes is necessarily given by their connection to the respective pole of the d.c. voltage source. From the German Offenlegungsschrift No. 2,151,590, for example, the use of a hollow cathode with an edge that protrudes in the direction of the substrate carrier in order to improve the uniformity of the distribution of layer thickness, is known. However, when a d.c. voltage is used, this protruding edge does not lead to a reversal of polarity.

From the German Patent No. 2,241,229, a device corresponding in general, to the device described supra is known. In this device, the surface area of the hollow electrode, because of its edge, is larger the surface of the other electrode (the substrate holder) directly facing the hollow space. As a result, when a high frequency is used, the hollow electrode assumes the function of an anode, so that, so to say, there is a reversal of the relationships with respect to the bias voltage. In a simplified way, this can be explained by considering the edge of the hollow anode to form the boundary of the discharge space, relative to which the metallic parts of the device, lying outside of this boundary, no longer exert the function of an electrode, so that the relationships are determined exclusively by the parts of the surface of the hollow anode on the one hand and of the substrate holder on the other, which face one another. This can be called an "edge effect".

However, for certain devices employing a continuous transport of substrate and using this principle, the known solution leads to some difficulties. For instance, if the substrate holder with the substrate is removed, at least the metallic baseplate of the vacuum chamber, which usually has a larger surface than the hollow electrode and is connected to ground, acts as a counter electrode. In this case, in a complete reversal of the potential relationships, the negative voltage develops on the hollow electrode, which now functions as a cathode.

It follows from this that the size of the gap between the edge of the hollow electrode on the one hand and the substrate or substrate holder on the other, is of essential importance for the development of the potential distribution in the region of the space filled by the plasma. Since said gap represents the connection between the plasma and its surroundings, the size of the gap determines whether the hollow electrode functions as the anode or the cathode of the arrangement. It was established by experiment that an enlargement of said gap by an amount of about 1 mm, drastically increases the influence of the remaining metal parts of the device and moreover with the result that a negative bias voltage is formed on the hollow electrode instead of on the substrate. With continuous devices, in which the substrate is disposed on movable substrate holders, such enlargements of the gap are practically unavoidable, especially when such substrate holders are moved at a distance from one another past the opening of the hollow electrode. The gap in question can also not be kept arbitrarily small, not only because this would make it necessary to guide the substrate holder with exceptional precision, but also because the substrate, lying on the surface of the substrate holder, would change the gap width during its passage through the installation, unless one takes the very expensive route of using a different substrate holder for each shape and size of substrate, a substrate holder in which the substrate is disposed recessed in and level with the surface of the substrate holder. With this, the range of applications of the known principle is greatly limited.

It is therefore an object of the invention to improve a device of the initially described kind so that it is insensitive to an enlargement of the gap and can be used especially also in devices with a continuous or quasi continuous transport of substrate, that is, in so-called "in-line installations".

DETAILED DESCRIPTION OF PREFERRED EMBODIMENTS

Figure 1:
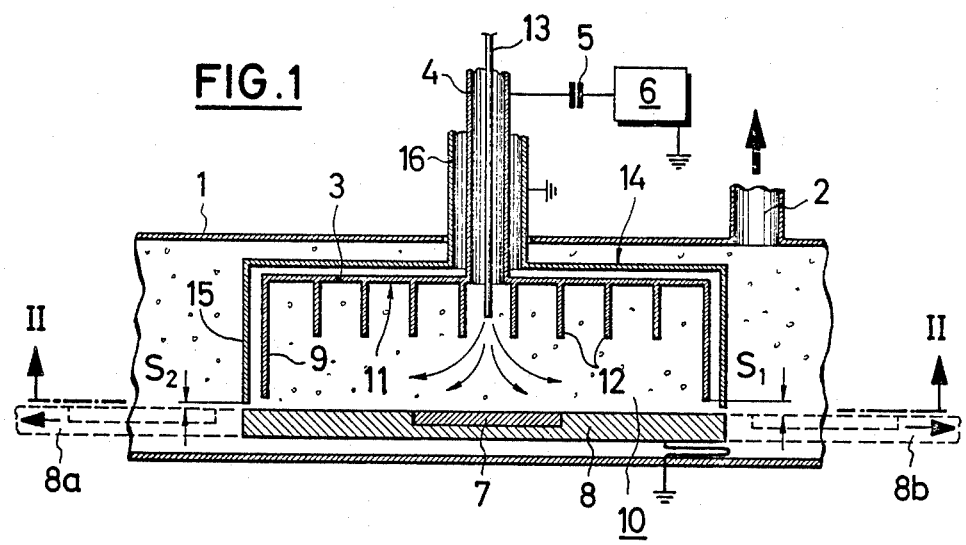
FIG. 1 shows a vertical axial section through a complete device for the passage of plate-shaped substrate holders.

The objective of the invention is accomplished with the device referred to at the beginning, owing to the fact that projections, enlarging the internal surface area of the hollow anode, are disposed in the hollow space of said hollow anode.

Through these projections, the surface area of the hollow anode facing the plasma is increased appreciably, so that the plasma inclusion is maintained even when there is a marked increase in the gap width and so that there is no reversal of the potential relationship, even when the mobile or moveable substrate holder is transported relative to the opening of the hollow anode. In this connection, the geometric shape of the projections is not critical; they should merely bring about as large an increase as possible in the surface area; however the distances between the projections or the hollow spaces formed between the projections and the edge should not be dimensioned so small, that the surface enlargement would be ineffective with respect to the plasma. The distances should not be less than twice the so-called "dark space distance". Moreover, as a consequence of the enlargement of the internal surface area of the hollow anode, there is also an increase in the negative charge that develops relative to the hollow anode on the surface of the substrate and of the substrate holder. This results in a corresponding increase in the kinetic energy of the positively charged ions from the plasma space striking the substrate.

In those cases where the inventive device is used as an etching device, this leads to an increase in the specific etching rate. In those cases where layers are deposited from the gas phase, the bombardment of the layer growing on the substrate with positive ions leads to particularly high-grade layers, because particles, which are bound less strongly to the layer, are sputtered off at the same time.

Due to the inventive measure, the properties of the hollow anode are fully retained, even if the substrate is transported continuously. The plasma is enclosed completely by material walls, in contrast, for example, to an enclosure by magnetic fields, which is never complete, especially when high frequency is used. Moreover, the plasma density, which is achieved by the hollow anode in the plasma space due to the complete enclosure, cannot be attained by means of magnetic field, assuming that the electric power per unit area is the same. Furthermore, investigations have shown that, with the exception of a decrease in the immediate edge region, the plasma density in the whole of the hollow space of the hollow anode is so uniform, that no deviation can be observed optically. The decrease in the plasma density in the edge region is limited to less than 5 mm. This leads to deviations in the layer thickness of less than ±3%, a value which cannot be attained with magnetic inclusion of the plasma.

The inventive construction of the anode can easily be carried out moreover by a casting process or by assembling metallic strip material. The hollow cathode of the state of the art can easily be exchanged for one of the invention without requiring complicated structural alterations to the whole device.

The inventive device is suitable for plasma polymerization, that is, for depositing polymer layers on substrates and especially for depositing amorphous carbon as a protective layer on substrates. For the last-mentioned purpose, a gaseous hydrocarbon is introduced into the hollow space of the hollow anode, the reaction products (mainly hydrogen) being discharged by methods described in greater detail further below.

In the case of hollow anodes, which protrude into a vacuum chamber so that their outside also is exposed at least partly to the vacuum, the hollow anode is required to be surrounded on its outside by dark space shielding, which also has an edge, which is drawn out in the direction of the second electrode and which is at the same potential as the dark space shielding. In a further development of the invention, it is particularly advantageous if the edge of the dark room shielding all around forms a gap "$s_2$" relative to the second electrode (the substrate holder), the gap not exceeding 10 mm.

In accordance with, once again a further development of the invention, such a device can be characterized additionally by to the fact that electrical coupling elements are disposed on the periphery of the dark space shielding. In the space of the gap "$s_2$", the coupling elements run essentially parallel to the adjacent surface of the second electrode (the substrate holder). Such coupling elements provide the additional advantage that the gap "$s_1$" can be dimensioned even larger than before the "edge effect" disappears.

Examples of and possibilities for the geometric development of these coupling elements are explained more closely in the detailed description. To explain their significance, reference is once again made to the state of the art as given in the German Patent No. 2,241,299.

In spite of the fact that the substrate holder is connected directly with the high frequency ground point, that is, with the metallic vacuum chamber, by a copper strand of large cross section that is bolted at both ends, the substrate holder was not at all at ground potential, as can be seen by the development of a closed plasma zone around the whole of the substrate holder. The relationships in installations with movable substrate holders are far more difficult to control, since permanent connections to ground cannot be established there.

Due to the inventive arrangement of coupling elements, which preferably comprise metal sheets running parallel to the neighboring surface of the substrate holder, coupling of the substrate holder to the dark space shielding is achieved under high frequency conditions, as a result of which the inclusion of the plasma is improved even further. Provided that the length or width of the coupling elements was adequate (for example 10 cm), satisfactory inclusion of the plasma with a negative bias at the substrate holder could be achieved and moreover for distances $s_2$ of up to 3 mm in spite of the otherwise insulated installation of the substrate holder.

The inclusion of the plasma and the complete negative bias of the substrate were retained with movable substrate holders even when the one edge of the substrate holder barely covered the hollow space of the hollow anode. For coupling elements with a surface area of 800 $cm^2$ and an $s_2$ space of 0.3 cm, for example, a plate capacitor with a capacitance of 235 pF is formed, from which an a.c. resistance, R, of 313 ohms is calculated for the normal frequency of 13.56 MHz. For the usual bias voltages of 1 kV, wattages of the order of 1 to 2 kW can thus readily be transferred over this capacitance. Only at wattages higher than about 1.5 kW (corresponding to a surface wattage of about 4 W/cm² of substrate surface) could the development of a plasma, which however was extremely weak, be observed around the substrate holder. However, this plasma had no noticeable effect on the polarity relationships in the plasma space, that is, the strictly capacitive coupling of the substrate holder over the coupling elements to the high frequency zero point was substantially more effective than the connection over a copper strand, which is normal in the state of the art. Moreover, a gap $s_2$ of the order of 3 mm can be realized readily even for very large substrate holders.

The following discussion of FIGS. 1–7 will further explain the invention.

In FIG. 1, a vacuum chamber 1 is, shown which can be evacuated over a suction stub 2 to a pressure normal for such plasma processes. In the cover of the vacuum chamber, a hollow anode 3 is inserted, which is connected over an electrically conducting supporting device 4 and a capacitor 5 with a high frequency source 6. Below the hollow anode 3, there is a second electrode 8, which carries the substrate 7 and forms the substrate holder. Over the whole of its (rectangular) extent, the hollow electrode has an edge 9, which is drawn out in the direction of the electrode 8 and is at the same potential as the hollow anode 3, said edge forming a gap "$s_1$" of 2 mm all around relative to the second electrode.

Figure 2:
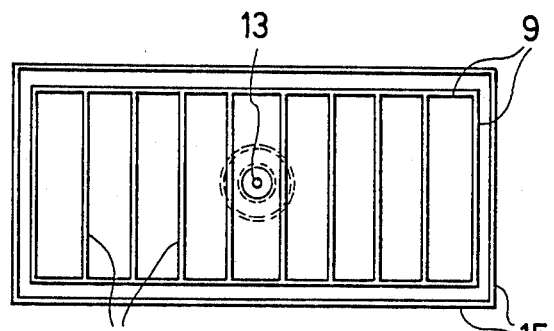
FIG. 2 shows a view of the hollow anode from below from the plane II—II in FIG. 1.

The hollow anode 3 consequently encloses a hollow space 10, the internal surface 11 of which is enlarged by the projections 12, which are formed by parallel ribs (see also FIG. 2). The distance between these projections should be substantially larger than twice the dark space distance at the vacuum used which, for vacuums of about $2 \times 10^{-2}$ mbar, leads to a practical usual distance between the projections and between the projections and the edge 9 of about 20 mm. The height of the ribs is not limited here; in the interest of a good homogeneity of the gas composition in the region of the substrate 7, it should, however, not be greater than about half the height of the edge 9. These relationships are shown approximately to scale in FIG. 1.

For introducing the appropriate treatment gases, a gas feed pipe 13 is provided, which is connected with a source (not shown) of the gas to be used. The gas feed pipe 13 discharges into the hollow space 10. The distribution of the gas can be improved by a distributing pipe (not shown here), which extends over the greater part of the length or width of the hollow space 10 and has a large number of outlet holes over its entire length. The lower (rectangular) border running along edge 9 which, at the same time, defines the gap with the width "$s_1$", is the opening of the hollow anode 3.

With the exception of the lower opening, the hollow anode 3 is surrounded all-around by a parallelepiped-shaped dark space shielding 14, the edge 15 of which forms a gap "$s_2$" 2 mm wide relative to the second electrode 8. The uncomsumed reaction products of the gases supplied enter and leave over gaps $S_1$ and $s_2$. The dark space shielding 14 is connected electrically over a further supporting device 16 with the vacuum chamber 1 and therefore, together with the vacuum chamber, is at ground potential.

The left and right ends of the vacuum chamber 1 are each connected wtih a separate vacuum transfer tube, neither of which is shown here and through which the electrodes 8, serving as substrate holders, are sequentially brought into the installation and taken out once again. Two further positions of the electrode 8, in its way through the installation, are shown by broken lines at 8a and 8b.

Figure 3:
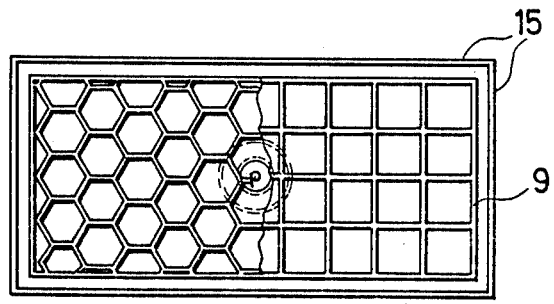
FIG. 3 shows a view from below, similar to that in FIG. 2, however with two differently developed projections within the hollow anode.

FIG. 3 shows two further variations of the projections 12 in FIG. 1. In the left half of FIG. 3, projections are shown, which combine to form a honeycomb pattern, while in the right half of FIG. 3, projections are shown which are constructed as assemblages of ribs crossing one another.

Figure 4:
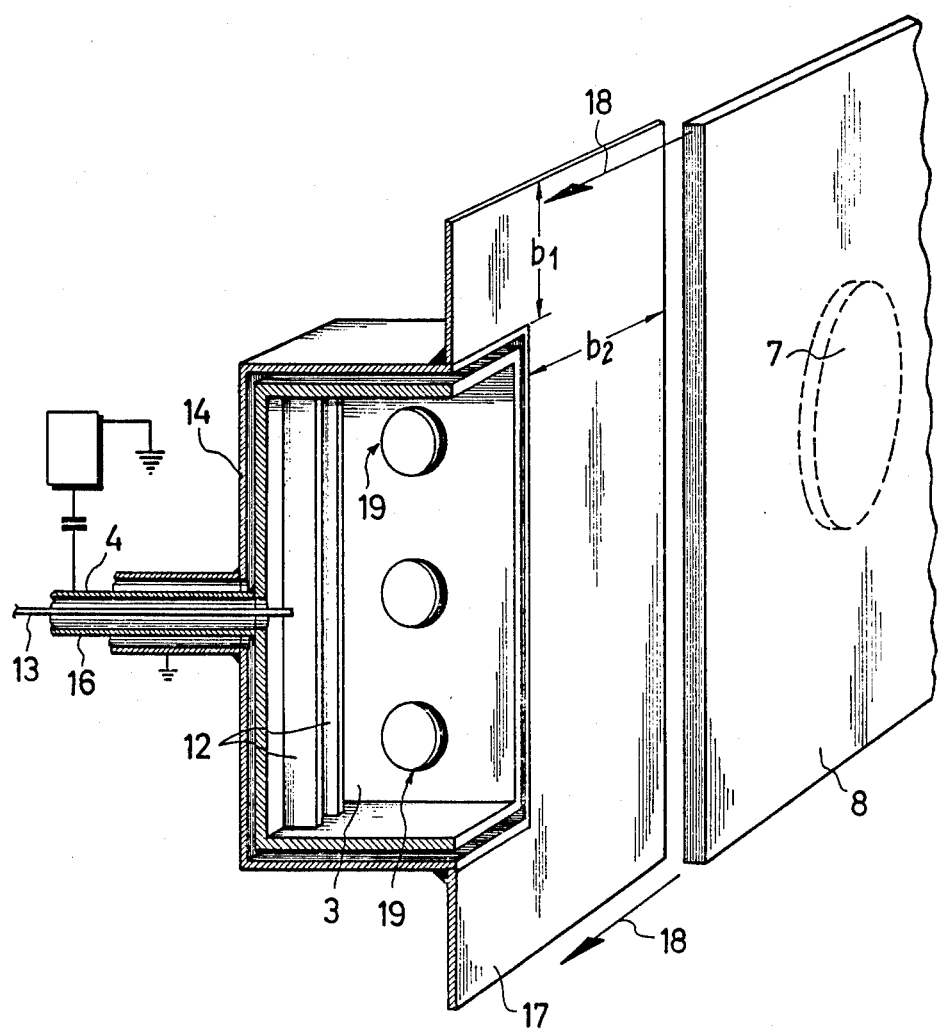
FIG. 4 shows a perspective representation of a hollow anode with a coupling element, cut open along a plane of symmetry of the hollow anode.

FIG. 4 shows a hollow anode 3 with projections 12, which is cut open along its one plane of symmetry and a dark space shielding 14 in complete analogy to FIG. 1. On the periphery of the dark space shielding 14, which is also shown cut open along its one plane of symmetry, there is an electrical coupling element 17, which is constructed in the form of a rectangular, flat frame consisting of metal and joined by an electrically conducting connection to the dark space shielding 14. The width $b_1$ and $b_2$ of the frame is between 4 and 12 cm. The arrangement is such that the coupling element 17 finishes exactly flush with the open underside or edge of the dark space shielding 14. In the space of gap $s_2$, the electrode 8 carrying the substrate 7 is moved in the direction of the two arrows past the opening of the hollow anode 3. For the purpose of electrically coupling electrode 8 completely adequately, it is sufficient if this electrode covers three sides of the perimeter of coupling element 17.

As is furthermore evident from FIG. 4, there are openings 19 in the wall areas of the hollow anode 3 and of the dark space shielding 14 for discharging the unconsumed reaction products of the gases supplied. Details of these openings 19 are explained in greater detail by means of FIG. 5.

Figure 5:
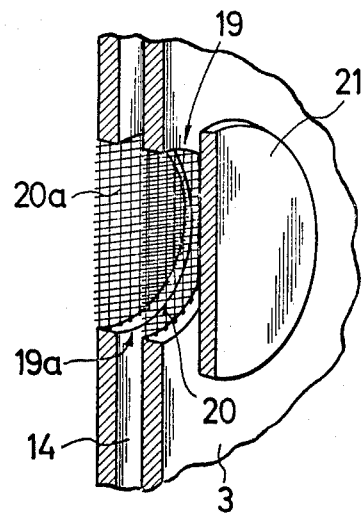
FIG. 5 shows a detail from FIG. 4 in perspective representation on an enlarged scale.

FIG. 5 shows cutaway portions of wall parts, namely from the edges of the hollow anode 3 and the dark space shielding 14 on an enlarged scale. The mutually flush openings 19 and 19a are provided with high frequency-impermeable grids 20 and 20a respectively, in front of each of which a shielding element 21 in the form of a circular disk, facing the hollow space 10, is arranged. By these means, the plasma is enclosed as if by a solid wall, the transport of gas, however, being practically unimpeded. Conventional, commercial metal mesh, with a clear width between meshes of a few tenths of a millimeter, comes into consideration for the frequency of 13.56 MHz, which is preferably used. The degree of optical transmission of such meshing is between 40 and 70%. The function of the shielding element 21 is to prevent atomization of the grids when the hollow anode is operated in the open mode, without an electrode in front of it. The distance between this shielding element and the surface of the hollow anode 3 assigned to it is about 5 mm.

Figure 6:
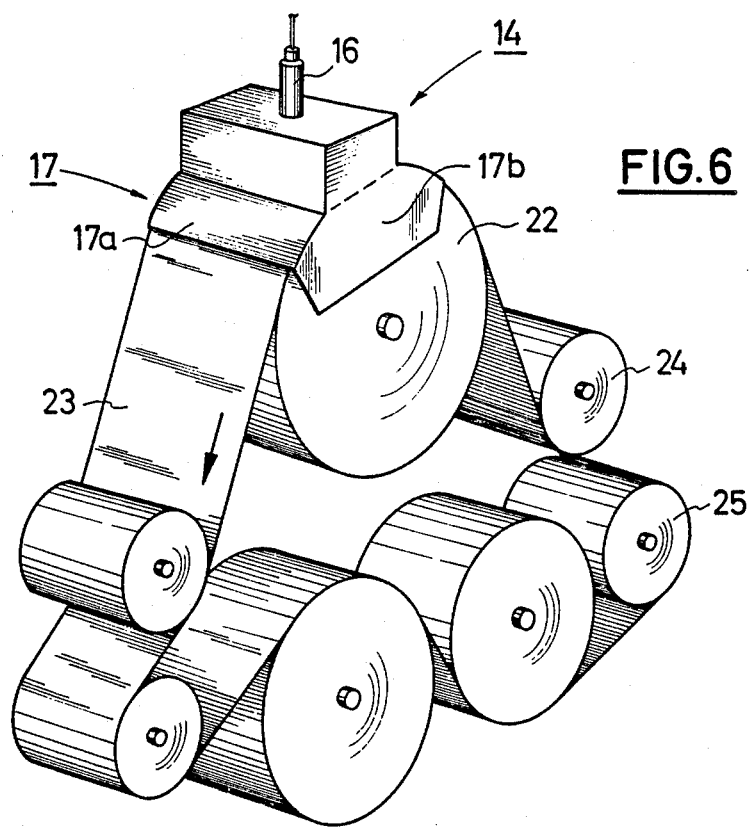
FIG. 6 shows an arrangement similar to that of FIG. 4, but with a cylinder-shaped substrate holder for the plasma treatment of flexible, belt-shaped substrates.

FIG. 6 shows a variation of the object of the invention shown in FIG. 4. In this variation, the second electrode 22 comprises a metallic cooling cylinder, over which a belt-shaped substrate 23 is guided, which comes from a supply roll 24 and is conducted to a take-up cylinder 25. The other cylinders in between either are guide rolls or cooling cylinders for further treatments, which are, however, of no further interest here. Of the hollow anode, only the dark space shielding 14 is shown here which, just as the hollow anode that is not shown, is adapted to the cylindrical contour of the electrode 22. In order to keep the axial extent of the arrangement small here, the electrical coupling element 17 is composed of several parts. In the region of the cylinder surface of electrode 22, the coupling element has a cylindrical part 17a on each side, of which only the front one can be seen in FIG. 6. In the region of the circular faces of the second electrode 22, the coupling element 22 comprises two flat pieces 17b, of which also only the front one is visible. Parts 17a and 17b, however, entirely fulfill the requirement that, in the gap $s_2$, they run essentially parallel to the adjacent surface of the second electrode 22.

Figure 7:
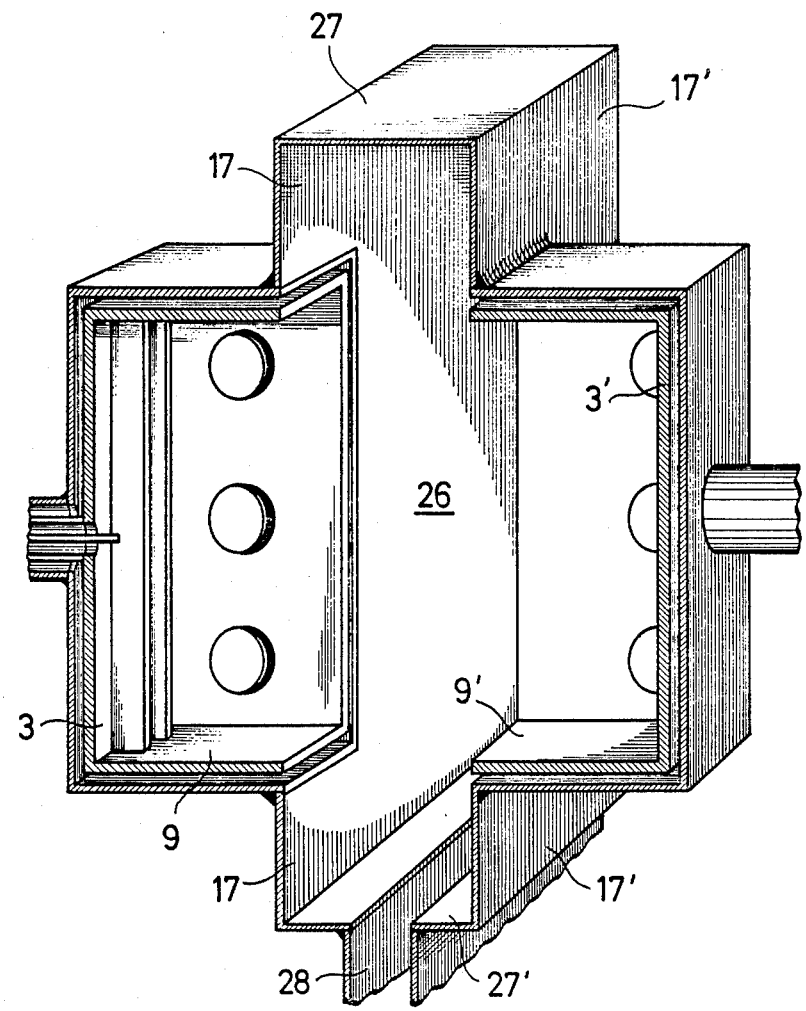
FIG. 7 shows a doubling of the device of FIG. 4 in mirror symmetrical arrangement.

FIG. 7 shows the mirror symmetrical doubling of the device of FIG. 4. Moreover, the hollow anode 3 is so arranged relative to a second hollow anode 3', that their edges 9 and 9' respectively are aligned with one another and that the coupling elements 17 and 17', between themselves, enclose a space 26, which serves for the passage of appropriately shaped substrates and moreover with or without a special substrate holder. In the absence of such a substrate holder, the substrate assumes the role of the second electrode. For the sake of simplicity, the necessary guiding devices are not shown. The coupling elements 17 and 17' are connected more or less to each other by a chime 27 or 27'; in any case however, the connection is electrically conducting. In the lower wall of the chime 27', there is a slot 28, through which the transporting device (not shown) can reach.

In the front and rear walls (not visible) of the chimes 27 and 27', there are openings. The hollow anode 3' may have its own source of high frequency or be connected to the high frequency source 6 of hollow anode 3. The hollow anodes 3 and 3' may also be combined into an anode box, which has only inlet and outlet openings for the substrate or the second electrode.

EXAMPLE 1

In a device of FIG. 4, the opening of the hollow anode 3 had the dimensions of 40 cm × 10 cm. An argon atmosphere was maintained at a pressure of $2 \times 10^{-2}$ mbar and the hollow anode was operated with a frequency of 13.56 MHz and a wattage of 420 watt in all. At this point in time, the second anode 8 was not yet in front of the opening, so that the "hollow anode" was operated as a cathode, which could be recognized by the development of a clearly visible plasma in the region of the opening. There was no measurable bias voltage. The second electrode 8, on which there was a substrate 7 of metal, was then moved in front of the cathode. At the very moment at which the hollow anode 3 was barely covered by the electrode 8, the power, coupled into the plasma, jumped to the previously set desired value of 1 kW. This corresponded to a power per unit area of substrate surface lying under the hollow anode of 2.5 W/cm². At the same time, a d.c. voltage of 1 kV was built up between the hollow anode and the substrate, as a result of which the substrate was biased negatively. The electrode 8 was stopped in this position and the substrate was etched. A subsequent examination of the substrate revealed that the etching rate has been 1 nm/s.

EXAMPLE 2

In the same device, a pressure of $3 \times 10^{-2}$ mbar of acetylene ($C_2H_2$) was maintained dynamically. In much the same way as in Example 1, a plasma was visible in the opening of the hollow anode after the high frequency source was switched on and the power was also set to 420 watts without a bias voltage being detectable.

After the electrode 8 was moved in front of the hollow anode, the power, coupled into the plasma, jumped to the previously set desired value of 1 kW, corresponding to a power per unit area also of 2.5 W/cm². The bias voltage in this case amounted to 600 V. This process was repeated for a period of 100 seconds. Subsequent examination revealed a layer of amorphous carbon, 300 nm thick, corresponding to a static coating rate of 3 nm/s. The interference color produced by the substrate surface and the layer did not show any detectable deviations in the layer thickness, with the exception of a narrow edge region about 5 mm wide.

We claim:

1. Device for plasma treatment of a substrate in a high frequency excited plasma discharge between two electrodes which face each other supplied by a high frequency source, said device comprising:
   (a) a first electrode constructed as a hollow anode, said first electrode containing a wall area and at least one edge, said edge drawn in the direction of a second electrode, wherein said edge and said wall area define a hollow space of said first electrode, said edge and said hollow anode having the same potential, said wall area having disposed thereon a plurality of projections which extend into said hollow space to increase its internal surface area, and
   (b) a second electrode for carrying said substrate, said second electrode facing said first electrode and in front of said hollow space, wherein said edge and said second electrode form a gap of maximum width 10 mm.

2. Device of claim 1, wherein said projections are rib shaped.

3. Device of claim 2, wherein said rib shaped projections cross each other.

4. Device of claim 1, wherein said first electrode is surrounded by a dark space shielding, said dark space shielding comprising a wall area and an edge projecting therefrom, wherein said dark space shielding edge has the same potential as said shielding, and forms a gap with said second electrode with maximum width of 10 mm.

5. Device of claim 4, wherein at least one electrical coupling element is disposed on the periphery of said dark space shielding and runs parallel to the surface of said second electrode.

6. Device of claim 1, comprising at least one gas pipe which leads into said hollow space.

7. Device of claim 6, comprising a plurality of openings for passage of gas, said openings comprising grids impermeable to a plasma produced in said device which are disposed in said wall areas of said first electrode and said dark space shielding.

8. Device of claim 7 further comprising shielding elements positioned in front of said grids.

9. Device of claim 1, further comprising a second hollow anode wherein said first and second anode are placed in a mirror-like symmetrical array, in an essentially closed chamber wherein said anodes are complementary to each other and are positioned so that said second electrode or a substrate positioned on said second electrode passes through a symmetrical plane formed between said hollow anodes.

10. Device of claim 9, wherein said device further comprises a pair of coupling elements disposed parallel to each other and connected to a chime so as to connect said first and second anode, and to at least one of said second electrode or a substrate positioned thereupon, on both sides of said second electrode.

11. Method for plasma treatment of a substrate in a high frequency excited plasma discharge between two electrodes supplied by a high frequency source, comprising placing a substrate on the second electrode of the device of claim 1 and supplying a reactive gas to said device to produce a layer for deposit on said substrate.

* * * * *